(12) United States Patent
Sicard

(10) Patent No.: US 8,259,427 B2
(45) Date of Patent: Sep. 4, 2012

(54) POWER TRANSISTOR CIRCUIT

(75) Inventor: Thierry Sicard, Chandler, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 554 days.

(21) Appl. No.: 12/554,537

(22) Filed: Sep. 4, 2009

(65) Prior Publication Data

US 2011/0057592 A1 Mar. 10, 2011

(51) Int. Cl.
*H02H 3/00* (2006.01)
(52) U.S. Cl. ....................................... 361/100
(58) Field of Classification Search .................. 361/100
See application file for complete search history.

(56) References Cited

U.S. PATENT DOCUMENTS

| | | | |
|---|---|---|---|
| 6,135,096 A | 10/2000 | Bolz et al. | |
| 6,229,383 B1 * | 5/2001 | Ooishi | 327/540 |
| 6,441,669 B2 * | 8/2002 | Ooishi | 327/308 |
| 6,683,767 B2 * | 1/2004 | Ito et al. | 361/56 |
| 7,495,939 B2 | 2/2009 | Kimura | |
| 8,030,986 B2 * | 10/2011 | Sicard | 327/309 |
| 2007/0103988 A1 | 5/2007 | Bauer et al. | |
| 2007/0268726 A1 | 11/2007 | Kojori et al. | |
| 2008/0231240 A1 | 9/2008 | Parkes, Jr. et al. | |
| 2008/0259515 A1 | 10/2008 | Turpin et al. | |

OTHER PUBLICATIONS

PCT/US2010/044550 International Search Report and Written Opinion dated Apr. 21, 2011.

* cited by examiner

*Primary Examiner* — Stephen W Jackson
(74) *Attorney, Agent, or Firm* — James L. Clingan, Jr.; Joanna G. Chiu

(57) ABSTRACT

A power transistor has a first current electrode coupled to a first power supply terminal and a second current electrode as an output of the circuit. A driver control circuit is coupled between a first and a second internal power supply node and is coupled to a control electrode of the power transistor. A first switch selectively couples the first power supply terminal to the first internal power supply node. A second power supply terminal is coupled to the second internal power supply node. A diode has an anode coupled to the second internal power supply node. A second switch is coupled between the diode and the output of the circuit such that, when the circuit is in active mode, it selectively couples the cathode of the diode to the output of the circuit based on whether or not the second power supply terminal is coupled to an external ground.

20 Claims, 1 Drawing Sheet

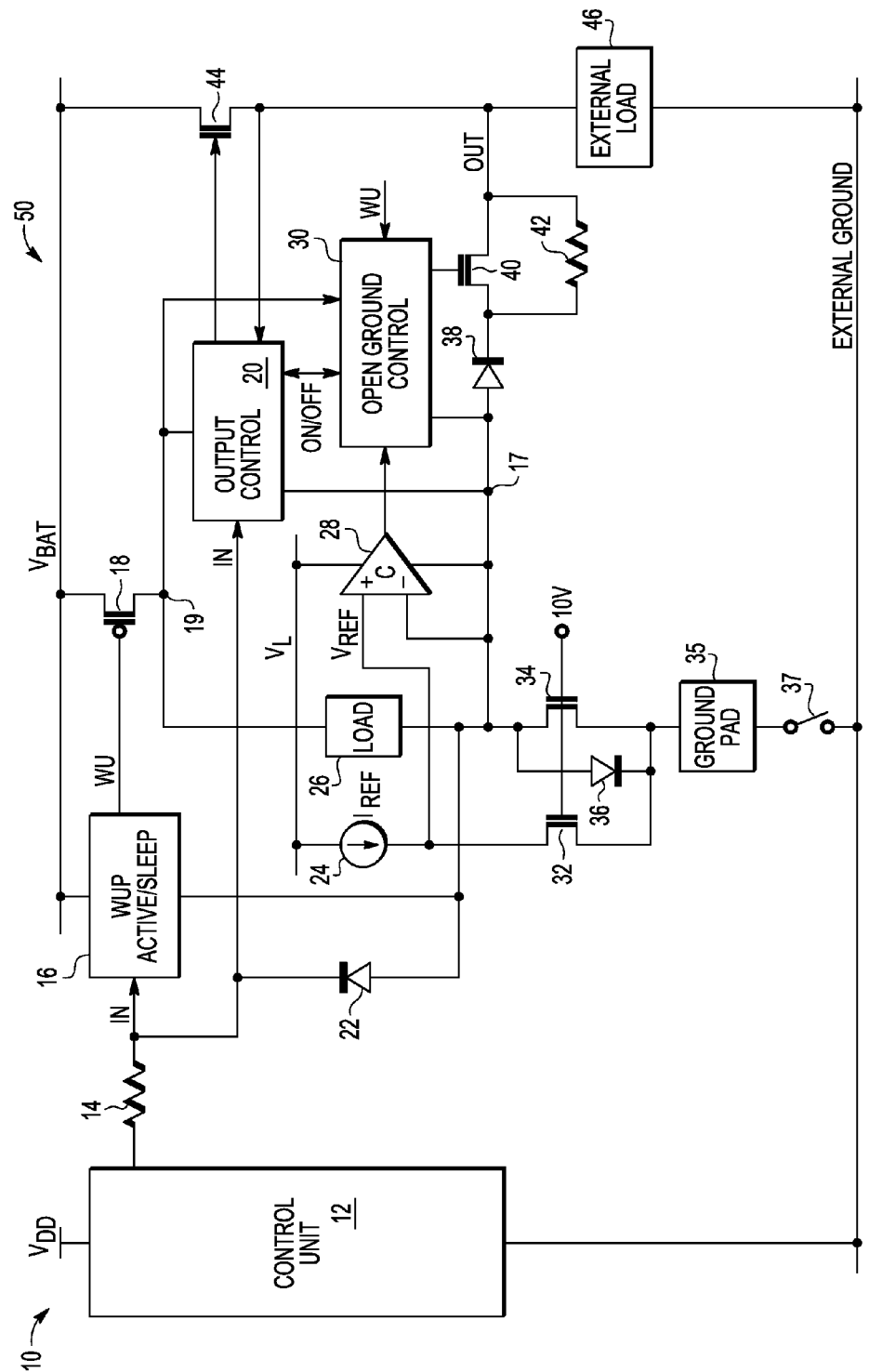

POWER TRANSISTOR CIRCUIT

BACKGROUND

1. Field

This disclosure relates generally to power circuits, and more specifically, to power transistor circuits.

2. Related Art

Power transistors play a critical role in supplying electrical power in a controlled manner to an electrical motor. Electrical motors are useful in a variety of applications that can range widely. Examples include appliances, industrial applications, and automotive applications. Providing proper control and protection of the power transistor is important for useful and reliable operation of a motor. Thus, it is not just a matter of providing a power transistor but circuitry that aids in issues relating to protection and control. Protection includes avoiding excessive stress on the transistor. Excessive stress can occur in a variety. Often they occur during at turn-on or turn-off which can occur under more than one condition. For example, losing a ground connection and acquiring a ground connection are events than can affect stresses applied to the power transistor.

Accordingly, there is a need for further improvements relating to stresses applied to a power transistor.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The sole FIGURE is a power transistor circuit according to an embodiment.

DETAILED DESCRIPTION

In one aspect, a power transistor circuit includes a power transistor and a circuit that protects the power transistor during times when the input to the power transistor is active but the ground connection is either not yet present or becomes disconnected. This is better understood by reference to the drawing and the following description.

Shown in the FIGURE is an external resistor 46 and a power circuit 10 comprising a control unit, 12, a resistor 14, a wakeup circuit 16, a P channel transistor 18, an output control circuit 20, a diode 22, a current source 24, a load 26, a comparator 28, an open ground control circuit 30, an N channel transistor 32, an N channel transistor 34, a diode 36, a diode 38, an N channel transistor 40, a resistor 42, a power transistor 44 that is an N channel transistor, a pad 35, and a connection 37, and an external load 46. Control unit 12 has a positive power supply terminal connected to a positive supply voltage terminal VDD, which in this example is preferably about 5 volts, and a negative power supply terminal connected to external ground. Control unit 12 has an output that is active to indicate that power transistor 44 is to provide an active output. In this case, an active output is a positive voltage that may be five volts. Resistor 14 has a first terminal connected to the output of control unit 12 and a second terminal. Wakeup circuit 16 has an input coupled to the second terminal of resistor 14, a positive power supply terminal coupled to a power supply terminal Vbat, a negative power supply terminal coupled to internal ground terminal 17, and an output. Transistor 18, which functions as a switch, has a source connected to Vbat, a gate connected to the output of wakeup circuit 16, and a drain connected to a node 19 which may be considered an internal power supply node. Output control circuit 20 has a first input connected to the second terminal of resistor 14, a positive power supply terminal connected to node 19, a negative power supply terminal connected to node 17, a second input coupled to a source of transistor 44, an output connected to a gate of transistor 44, and a third input. Diode 22 has a cathode connected to the second terminal of resistor 14 and an anode coupled to node 17. Current source 24 has a first terminal coupled to a low voltage power supply node VL which may be for having a voltage of about 2.5 volts and a second terminal. Load 26 has a first terminal coupled to node 19 and a second terminal connected to node 17. Comparator has a positive input connected to the second terminal of current source 24, a negative input connected to node 17, a positive power supply terminal connected to node VL, a negative power supply terminal connected to node 17, and an output. Open ground control circuit 30 has a first input coupled to the output of comparator 28, a first output connected to the third input of output control circuit 20, a second input connected to the output of wakeup circuit 16, a positive power supply terminal connected to node 19, a negative power supply terminal connected to node 17, and an output connected to a gate of transistor 40. Transistor 32 has a first current electrode connected to the second terminal of current source 24, a gate connected to a bias voltage which may be 10 volts, and a second current electrode connected to pad 35. Transistor 34 has a first current electrode connected to node 17, a gate connected to the bias voltage, and a second current electrode connected to pad 35. Diode 36, which is an artifact of node 17 being connected to a substrate that is p-type and pad 35 being connected to an N well in which the N well has a junction with the substrate, has an anode connected to node 17 and a cathode connected to pad 35. Connection 37 is the connection between external ground and pad 35. Connection 37 is not always assured of providing the desired connection because the module that includes circuit 10 may not have the ground connection completed. Connection 37 may be a manually removable connection or one made under electronic control. Diode 38 has an anode connected to node 17 and a cathode. Transistor 40 has a first current electrode connected to the cathode of diode 38, a gate connected to the second output of open ground control circuit 30, and a second current electrode connected to an output of circuit 10. Resistor 42 has a first terminal connected to the cathode of diode 38 and a second terminal connected to the output of circuit 10. Transistor 44 has a drain connected to Vbat and a source connected to the output of circuit 10. The gate of transistor 44, as described previously, is connected to output control circuit 20. External load 46 has a first terminal connected to the output of circuit 10 and a second terminal connected to external ground. Circuit 10 may be considered to be in two different integrated circuits; one for control unit 12 and another for the remainder of circuit 10 which is shown as power transistor circuit 50. A variation is for transistor 44 to be a discrete device separate from an integrated circuit in which the integrated circuit comprises circuit 50 minus the power transistor, transistor 44. This can be stated as circuit 10 being two integrated circuits and a discrete device and circuit 50 being an integrated circuit and the discrete device. Circuit 10 is designed for load 46 being a motor but it is not required for that to be the case.

In basic form and connection 37 completing the connection between pad 35 and external ground, the operation is for control unit 12 to provide an active signal to output control circuit 20 which, which may use processing well known to those of ordinary skill in the art, provides a signal to transistor 44 which in turn provides a current to load 46 at a voltage near Vbat. The voltage at Vbat, for automotive applications is likely to be 14 volts. At the onset of this operation, circuit 10 may be in a sleep mode in which case Vbat is not coupled to most of circuit 10 with transistor 18 being non-conductive so that node 19 is decoupled from Vbat. Also pad 35 may not be connected to the external ground. For such case, wake up circuit has a ground connection through node 17, diode 38, resistor 42, and load 46. With this ground connection and being connected to Vbat, wakeup circuit 16 responds to the active output of control unit 12 and provides a signal to transistor 18 that causes transistor 18 to couple Vbat to node 19. Open ground control circuit 30 responds to the active output of wakeup circuit by causing transistor 40 to become conductive, improving the grounding of node 17. With pad 35 decoupled from external ground, the positive input of comparator 28 is at a higher voltage than the negative input. The current path to ground for current source 24 is through transistors 32 and 34 and node 17 so node 17 has to be at a lower voltage than the output of current source 24 at the first current electrode of transistor 32. Thus comparator 28 provides a logic high output which indicates that pad 35 is decoupled from the external ground. When such is the case, open ground control circuit 30 keeps transistor 40 conductive. Transistor 40 can be viewed as a switch. Open ground control circuit also provides an output to output control circuit 20 that prevents output control circuit 20 from providing an active signal to transistor 44. Thus transistor 44 is caused to be non-conductive by circuit 50 being in the open ground condition, which is the condition when connection 37 is not connecting pad 35 to the external ground.

When connection 37 connects pad 35 to external ground, transistor 32 couples current source 24 directly to ground dropping the voltage on the positive input of comparator 28 below that of the negative input of comparator 28. This results in comparator 28 switching its output to a logic low. Open ground control circuit 30 responds by disabling transistor 40 and providing an output to output control circuit 20 that allows output control to be enabled and thus cause transistor 44 to become conductive. Load 46 then receives current that allows it to perform its intended function. Comparator 28 thus functions to provide a signal that indicates that ground pad 35 has been connected to the external ground. This also lowers and stabilizes the voltage of node 17, the internal ground node, relative to external ground. Prior to pad 35 being connected to external ground, node 17 is coupled to ground through load 46, which may vary in its impedance, diode 38, transistor 40, and resistor 42.

Another possibility that can occur is for the ground connection to be interrupted while the power transistor, transistor 44, is actively supplying current to load 46. In such case current source 24 will have its connection to external ground through pad 35 broken causing an immediate rise in voltage and ensuring the voltage at the positive input of comparator is at a higher voltage than the voltage at node 17 which is connected to the negative input of comparator 28. Comparator 28 responds by switching to a logic high which causes open ground control circuit 30 to enable transistor 40 and cause output control circuit 20 to begin causing transistor 44 to become non-conductive. With transistor 44 not yet non-conductive the output voltage is near Vbat and effectively blocks a ground path from node 17 to load 46. Diode 22 couples node 17 to the input of output control circuit 20. Thus the input of output control circuit 20 is only about a forward-biased PN junction drop, about 0.7 volt, above node 17, which is the internal ground node. Thus, the voltage at the negative power supply terminal of output control circuit 20 is only about 0.7 volt above the input voltage. This also has the affect of causing output control circuit 20 to be non-responsive to the input and thus speed-up the process of causing power transistor 44 to become non-conductive. As the output voltage to load 46 decreases, the voltage on node 17 will drop potentially causing the input to output control circuit 20 to be sufficiently higher than the internal ground, node 17, to allow output control circuit 20 to be responsive. By this time though, output control circuit 20 will be disabled by the action of open ground control circuit 30 in response to comparator 28.

Thus, there is provided the ability to effectively disable the power transistor when the connection to external ground is not present. Transistor 40 is useful in achieving this objective. When circuit 10 is in an active mode which in this case is when control unit 12 provides an active output to circuit 50, transistor 40 selectively couples the cathode of the diode to the output of the circuit based on whether or not the internal ground, node 17, is coupled to the external ground. When circuit 10 becomes active in the absence of a detection that the internal ground is connected to the external ground, transistor 40 becomes active and then becomes inactive when the internal ground is detected as having been connected to the external ground. If during the active mode, this ground detection is lost, transistor 40 is enabled. Transistor 40 being enabled can be considered as a switch being closed and thus completing a connection. Circuit 50 is also effective for avoiding a problem if the Vbat and external ground connections are reversed. Having node 17 be separated from a direct connection to external ground is particularly useful for this purpose.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

By now it should be appreciated that a circuit has been provided that includes a power transistor having a first current electrode coupled to a first power supply terminal, a second current electrode as an output of the circuit, and a control electrode. The circuit further includes a driver control circuit coupled between a first internal power supply node and a second internal power supply node and having an output coupled to the control electrode of the power transistor, wherein the driver control circuit, when enabled, controls the power transistor. The circuit further includes a first switch having a first current terminal coupled to the first power supply terminal and a second current terminal coupled to the first internal power supply node, wherein the first switch selectively couples the first power supply terminal to the first internal power supply node. The circuit further includes a second power supply terminal coupled to the second internal power supply node. The circuit further includes a diode having an anode coupled to the second internal power supply node and a cathode. The circuit further includes a second switch having a first current terminal coupled to the cathode of the diode and a second current terminal coupled to the output of the circuit, wherein, when the circuit is in an active mode, the second switch selectively couples the cathode of the diode to the output of the circuit based on whether or not the second power supply terminal is coupled to an external ground. The circuit may further comprise wakeup circuitry coupled between the first supply voltage terminal and the second internal supply voltage node and receiving a wakeup signal, wherein, in response to the wakeup signal being asserted to indicate a transition of the circuit from a sleep mode to the active mode is to occur, the wakeup circuitry closes the first switch to couple the first power supply terminal to the first internal power supply node. The circuit may have a further characterization in which in response to the wakeup signal being asserted, the wakeup circuitry closes the second switch to couple to cathode of the diode to the output of the circuit. The circuit may have a further characterization in which in response to the wakeup signal being asserted, the wakeup circuitry closes the first switch and the second switch simultaneously. The circuit may further comprise control circuitry coupled between the first internal supply voltage node and the second internal supply voltage node and having an output coupled to a control electrode of the second switch, wherein, when the circuit is in active mode, the control circuitry controls the second switch based on whether or not the second power supply terminal is coupled to the external ground, wherein if the second power supply terminal is not coupled to the external ground, the control circuitry closes the second switch and if the second power supply terminal is coupled to the external ground, the control circuitry opens the second switch. The circuit may have a further characterization in which when the circuit is in active mode, if the second power supply terminal is coupled to the external ground, the control circuitry enables the driver control circuit to control the power transistor. The circuit may further comprise control circuitry coupled between the first internal supply voltage node and the second internal supply voltage node and having an output coupled to a control electrode of the second switch, wherein when the circuit is in active mode, the control circuitry controls the second switch based on whether or not the second power supply terminal is coupled to the external ground, wherein if the second power supply terminal is not coupled to the external ground, the control circuitry closes the second switch and if the second power supply terminal is coupled to the external ground, the control circuitry opens the second switch. The circuit may further comprise detection circuitry coupled to the second internal power supply node which detects whether or not the second power supply terminal is coupled to the external ground and provides an indication signal to the control circuitry in response thereto. The circuit may further comprise a comparator having a first input coupled to an input reference voltage and a second input coupled to the second internal power supply node, and an output which provides the indication signal to the control circuitry. The circuit may further comprise a transistor having a first current electrode coupled to the second internal power supply node, a second current electrode coupled to the second power supply terminal, and a control electrode coupled to receive an internal bias voltage. The circuit may further comprise a second diode having a cathode coupled to the wakeup signal and having an anode coupled to the second internal supply voltage node.

Also described is a method of operating a circuit coupled to a first internal power supply node and a second internal power supply node and having an output at a source of a power transistor, wherein the first internal power supply node is selectively coupled to a first power supply terminal, and the second internal power supply node is coupled to a second power supply terminal capable of being coupled to an external ground. The method includes in response to assertion of a wakeup signal to indicate a transition of the circuit from a sleep mode to an active mode, coupling the first internal power supply node to a first power supply terminal, wherein when the wakeup signal is negated to indicate the sleep mode, the first internal power supply node is decoupled from the first power supply terminal. The method further includes in response to the assertion of the wakeup signal, coupling the second internal power supply node to the output at the source of the power transistor via a switch. The method has a further characterization by which, after the step of coupling the second internal power supply node to the output at the source of the power transistor in response to the assertion of the wakeup signal, the method further includes determining whether or not the second power supply terminal is coupled to the external ground, if the second power supply terminal is not coupled to the external ground, maintaining the second internal power supply node coupled to the output at the source of the power transistor via the switch by maintaining the switch closed, and if the second power supply terminal is coupled to the external ground, opening the switch. The method has a further characterization by which the circuit further comprises a driver controller coupled between the first internal power supply node and the second internal power supply node and having an output coupled to the control electrode of the power transistor, wherein the method further includes, after the assertion of the wakeup signal, enabling the driver controller to control the power transistor. when the circuit is in active mode, the method further includes determining whether or not the second power supply terminal is coupled to the external ground, if the second power supply terminal is not coupled to the external ground, maintaining the second internal power supply node coupled to the output at the source of the power transistor by maintaining the switch closed, and if the second power supply terminal is coupled to the external ground, opening the switch. The method may have a further characterization by which determining further includes using a comparator to compare a voltage value of the second internal supply voltage node to a reference voltage.

Disclosed also is a circuit that includes a power transistor having a first current electrode coupled to a first power supply terminal, a second current electrode as an output of the circuit, and a control electrode. The circuit further includes a driver control circuit coupled between a first internal power supply node and a second internal power supply node and having an output coupled to the control electrode of the power transistor, wherein the driver control circuit, when enabled, controls the power transistor. The circuit further includes a first switch having a first current terminal coupled to the first power supply terminal and a second current terminal coupled to the first internal power supply node, wherein the first switch selectively couples the first power supply terminal to the first internal power supply node. The circuit further includes a second power supply terminal coupled to the second internal power supply node. The circuit further includes a first diode having an anode coupled to the second internal power supply node and a cathode. The circuit further includes a resistive element having a first terminal coupled to the cathode of the diode and a second terminal coupled to the output of the circuit. The circuit further includes a second switch having a first current terminal coupled to the cathode of the diode and a second current terminal coupled to the output of the circuit, wherein the second switch selectively couples the cathode of the diode to the output of the circuit. The circuit further includes wakeup circuitry coupled between the first supply voltage terminal and the second internal supply voltage node and receiving a wakeup signal, wherein, in response to the wakeup signal being asserted to indicate a transition of the circuit from a sleep mode to an active mode is to occur, the wakeup circuitry closes the first switch to couple the first power supply terminal to the first internal power supply node and closes the second switch to couple to cathode of the diode to the output of the circuit. The circuit further includes control circuitry coupled between the first internal supply voltage node and the second internal supply voltage node and having an output coupled to a control electrode of the second switch, wherein, when the circuit is in active mode, the control circuitry controls the second switch by closing the second switch if the second power supply terminal is not coupled to an external ground and opening the second switch if the second power supply terminal is coupled to the external ground. The circuit may further include a second diode having a cathode coupled to the wakeup signal and having an anode coupled to the second internal supply voltage node. The circuit may have a further characterization by which when the circuit is in active mode, the control circuitry enables the driver control circuit to control the power transistor when the second power supply terminal is coupled to the external ground and disables the driver control circuit when the second power supply terminal is not coupled to the external ground. The circuit may further include a transistor having a first current electrode coupled to the second internal power supply node, a second current electrode coupled to the second power supply terminal, and a control electrode coupled to receive an internal bias voltage.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, variations in the technique for performing the detection of the open ground condition may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit, comprising:
   a power transistor having a first current electrode coupled to a first power supply terminal, a second current electrode as an output of the circuit, and a control electrode;
   a driver control circuit coupled between a first internal power supply node and a second internal power supply node and having an output coupled to the control electrode of the power transistor, wherein the driver control circuit, when enabled, controls the power transistor;
   a first switch having a first current terminal coupled to the first power supply terminal and a second current terminal coupled to the first internal power supply node, wherein the first switch selectively couples the first power supply terminal to the first internal power supply node;
   a second power supply terminal coupled to the second internal power supply node;
   a diode having an anode coupled to the second internal power supply node and a cathode; and
   a second switch having a first current terminal coupled to the cathode of the diode and a second current terminal coupled to the output of the circuit, wherein, when the circuit is in an active mode, the second switch selectively couples the cathode of the diode to the output of the circuit based on whether or not the second power supply terminal is coupled to an external ground.

2. The circuit of claim 1, further comprising:
   wakeup circuitry coupled between the first supply voltage terminal and the second internal supply voltage node and receiving a wakeup signal, wherein, in response to the wakeup signal being asserted to indicate a transition of the circuit from a sleep mode to the active mode is to occur, the wakeup circuitry closes the first switch to couple the first power supply terminal to the first internal power supply node.

3. The circuit of claim 2, wherein, in response to the wakeup signal being asserted, the wakeup circuitry closes the second switch to couple to cathode of the diode to the output of the circuit.

4. The circuit of claim 3, wherein, in response to the wakeup signal being asserted, the wakeup circuitry closes the first switch and the second switch simultaneously.

5. The circuit of claim 3, further comprising:
   control circuitry coupled between the first internal supply voltage node and the second internal supply voltage node and having an output coupled to a control electrode of the second switch, wherein, when the circuit is in active mode, the control circuitry controls the second switch based on whether or not the second power supply terminal is coupled to the external ground, wherein if the second power supply terminal is not coupled to the external ground, the control circuitry closes the second switch and if the second power supply terminal is coupled to the external ground, the control circuitry opens the second switch.

6. The circuit of claim 5, wherein, when the circuit is in active mode, if the second power supply terminal is coupled to the external ground, the control circuitry enables the driver control circuit to control the power transistor.

7. The circuit of claim 1, further comprising:
   control circuitry coupled between the first internal supply voltage node and the second internal supply voltage node and having an output coupled to a control electrode of the second switch, wherein when the circuit is in active mode, the control circuitry controls the second switch based on whether or not the second power supply terminal is coupled to the external ground, wherein if the second power supply terminal is not coupled to the external ground, the control circuitry closes the second switch and if the second power supply terminal is coupled to the external ground, the control circuitry opens the second switch.

8. The circuit of claim 7, further comprising:
detection circuitry coupled to the second internal power supply node which detects whether or not the second power supply terminal is coupled to the external ground and provides an indication signal to the control circuitry in response thereto.

9. The circuit of claim 8, wherein the detection circuitry comprises:
a comparator having a first input coupled to an input reference voltage and a second input coupled to the second internal power supply node, and an output which provides the indication signal to the control circuitry.

10. The circuit of claim 1, further comprising:
a transistor having a first current electrode coupled to the second internal power supply node, a second current electrode coupled to the second power supply terminal, and a control electrode coupled to receive an internal bias voltage.

11. The circuit of claim 1, further comprising:
a second diode having a cathode coupled to the wakeup signal and having an anode coupled to the second internal supply voltage node.

12. A method of operating a circuit coupled to a first internal power supply node and a second internal power supply node and having an output at a source of a power transistor, wherein the first internal power supply node is selectively coupled to a first power supply terminal, and the second internal power supply node is coupled to a second power supply terminal capable of being coupled to an external ground, comprising:
in response to assertion of a wakeup signal to indicate a transition of the circuit from a sleep mode to an active mode, coupling the first internal power supply node to a first power supply terminal, wherein when the wakeup signal is negated to indicate the sleep mode, the first internal power supply node is decoupled from the first power supply terminal; and
in response to the assertion of the wakeup signal, coupling the second internal power supply node to the output at the source of the power transistor via a switch.

13. The method of claim 12, wherein, after the step of coupling the second internal power supply node to the output at the source of the power transistor in response to the assertion of the wakeup signal, the method further comprises:
determining whether or not the second power supply terminal is coupled to the external ground;
if the second power supply terminal is not coupled to the external ground, maintaining the second internal power supply node coupled to the output at the source of the power transistor via the switch by maintaining the switch closed; and
if the second power supply terminal is coupled to the external ground, opening the switch.

14. The method of claim 13, wherein the circuit further comprises a driver controller coupled between the first internal power supply node and the second internal power supply node and having an output coupled to the control electrode of the power transistor, wherein the method further comprises:
after the assertion of the wakeup signal, enabling the driver controller to control the power transistor.

15. The method of claim 12, wherein, wherein when the circuit is in active mode, the method further comprises:
determining whether or not the second power supply terminal is coupled to the external ground;
if the second power supply terminal is not coupled to the external ground, maintaining the second internal power supply node coupled to the output at the source of the power transistor by maintaining the switch closed; and
if the second power supply terminal is coupled to the external ground, opening the switch.

16. The method of claim 12, wherein determining further comprises:
using a comparator to compare a voltage value of the second internal supply voltage node to a reference voltage.

17. A circuit, comprising:
a power transistor having a first current electrode coupled to a first power supply terminal, a second current electrode as an output of the circuit, and a control electrode;
a driver control circuit coupled between a first internal power supply node and a second internal power supply node and having an output coupled to the control electrode of the power transistor, wherein the driver control circuit, when enabled, controls the power transistor;
a first switch having a first current terminal coupled to the first power supply terminal and a second current terminal coupled to the first internal power supply node, wherein the first switch selectively couples the first power supply terminal to the first internal power supply node;
a second power supply terminal coupled to the second internal power supply node;
a first diode having an anode coupled to the second internal power supply node and a cathode;
a resistive element having a first terminal coupled to the cathode of the diode and a second terminal coupled to the output of the circuit;
a second switch having a first current terminal coupled to the cathode of the diode and a second current terminal coupled to the output of the circuit, wherein the second switch selectively couples the cathode of the diode to the output of the circuit;
wakeup circuitry coupled between the first supply voltage terminal and the second internal supply voltage node and receiving a wakeup signal, wherein, in response to the wakeup signal being asserted to indicate a transition of the circuit from a sleep mode to an active mode is to occur, the wakeup circuitry closes the first switch to couple the first power supply terminal to the first internal power supply node and closes the second switch to couple to cathode of the diode to the output of the circuit; and
control circuitry coupled between the first internal supply voltage node and the second internal supply voltage node and having an output coupled to a control electrode of the second switch, wherein, when the circuit is in active mode, the control circuitry controls the second switch by closing the second switch if the second power supply terminal is not coupled to an external ground and opening the second switch if the second power supply terminal is coupled to the external ground.

18. The circuit of claim 17, further comprising:
a second diode having a cathode coupled to the wakeup signal and having an anode coupled to the second internal supply voltage node.

19. The circuit of claim 18, wherein, when the circuit is in active mode, the control circuitry enables the driver control circuit to control the power transistor when the second power supply terminal is coupled to the external ground and disables the driver control circuit when the second power supply terminal is not coupled to the external ground.

20. The circuit of claim 19, further comprising:
a transistor having a first current electrode coupled to the second internal power supply node, a second current electrode coupled to the second power supply terminal, and a control electrode coupled to receive an internal bias voltage.

* * * * *